United States Patent
Campbell et al.

[11] Patent Number: 6,126,456
[45] Date of Patent: Oct. 3, 2000

[54] SOLDER COLUMN TIP COMPLIANCY MODIFICATION FOR USE IN A BGA SOCKET CONNECTOR

[75] Inventors: Jeffrey S. Campbell, Lake Orion, Mich.; Robert W. Nesky, Nicholson, Pa.

[73] Assignee: International Business Machines Corporation, Armonk, N.Y.

[21] Appl. No.: 09/400,145

[22] Filed: Sep. 21, 1999

Related U.S. Application Data

[62] Division of application No. 09/034,940, Mar. 4, 1998, Pat. No. 6,010,340.

[51] Int. Cl.[7] .............................. H01R 12/00; H05K 1/00
[52] U.S. Cl. ................................................ 439/74; 257/738
[58] Field of Search .................... 439/71, 70, 68, 439/330, 74

[56] References Cited

U.S. PATENT DOCUMENTS

| | | |
|---|---|---|
| 4,412,642 | 11/1983 | Fisher, Jr. . |
| 5,033,675 | 7/1991 | Shino . |
| 5,475,317 | 12/1995 | Smith . |
| 5,517,752 | 5/1996 | Sakata et al. .............. 29/832 |
| 5,534,667 | 7/1996 | Miyamoto et al. . |
| 5,545,589 | 8/1996 | Tomura et al. . |
| 5,691,041 | 11/1997 | Frankeny et al. ............ 439/71 |
| 5,738,531 | 4/1998 | Beaman et al. . |

*Primary Examiner*—Neil Abrams
*Assistant Examiner*—Hae Moon Hyeon
*Attorney, Agent, or Firm*—Ratner & Prestia; Lawrence R. Fraley

[57] ABSTRACT

A socket connector system for forming a separable electrical contact between a first circuit substrate and a second circuit substrate. A dendrite interposer is disposed between the first circuit substrate and the second circuit substrate. A solder body is disposed between the first circuit substrate and the dendrite interposer. The solder body may include one of several types of solder columns or a solder ball. The solder body has a contact end which engages the dendrite interposer. The contact end has a void. An area of the contact end engages the dendrite interposer when compressive forces are exerted on the first circuit substrate and the second circuit substrate. This provides for all areas of a plurality of contact ends to engage and form reliable electrical contacts with the contact pads.

11 Claims, 5 Drawing Sheets

SOLDER COLUMN TIP COMPLIANCY MODIFICATION FOR USE IN A BGA SOCKET CONNECTOR

This application is a divisional of U.S. patent application Ser. No. 09/034,940, filed on Mar. 4, 1998, now U.S. Pat. No. 6,010,340 which has been allowed.

FIELD OF THE INVENTION

The present invention relates generally to socketing single chip or multi chip modules by solder columns or balls and, more particularly, to a system for forming a separable and reliable electrical connection between circuit substrates.

BACKGROUND

In some electrical circuit packaging designs, it is desirable to provide a separable electrical connection between a single or multi-chip module substrate and the circuit board on which it is mounted. Such an electrical connection is generally considered "separable" if the chip module substrate can be easily unplugged from the circuit board and subsequently attached to another circuit board. The need for such separable connections is due to economies, in that it is cost-effective to use the same chip module substrates on a variety of circuit boards.

A conventional socket connector system is illustrated in FIG. 1. A first circuit substrate 10 and a second circuit substrate 12 are provided. A dendrite interposer 14 is disposed between first circuit substrate 10 and second circuit substrate 12. Dendrite interposer 14 is typically on the order of several millimeters thick. The Flexiposer™ interposer by International Business Machines Corporation is one such type of dendrite interposer 14. Dendrite interposer 14 includes: (a) a carrier 15 made of polyamide film or other similar type of circuit board material, and (b) pairs of electrical contact pads 16a and 16b attached to carrier 15. For a given pair, contact pads 16a and 16b are attached to carrier 15 on opposing sides and electrically coupled to one another through vias 18 formed in carrier 15. On a given contact pad 16a or 16b, a plurality of ridges 26 extend out from contact pads 16a and 16b toward one of the circuit substrates 10 or 12. Ridges 26 are typically needle-like structures of palladium which are grown off circuit contact pad 16a or 16b. Ridges 26 generally function to penetrate dust and debris in forming an electrical contact between mating surfaces of circuit substrates 10 and 12. Ridges 26 are typically on the order of 0.025 to 0.051 mm (1 to 2 mils) in height.

A solder body 20 is disposed between first circuit substrate 10 and electrical contact pad 16a attached to dendrite interposer 14. Mounting end 30 of solder body 20 is mounted to first circuit substrate 10. Contact end 32 of solder body 20 faces contact pad 16a. Compressive forces are exerted, in the direction of arrows A of FIG. 1, on first circuit substrate 10 and second circuit substrate 12 to force all areas of contact ends 32 to engage and form reliable electrical contacts with all of the contact pads 16a (see area 22 of FIG. 1).

According to the conventional socket connector system illustrated in FIG. 1, however, rarely do all of the solder bodies 20 form reliable electrical contacts with the contact pads 16a. Often, solder body 20 makes only a poor or non-existent electrical contact with contact pad 16a (see area 24 of FIG. 1). This results from at least two inherent tolerance variations in the conventional socket connector system of FIG. 1. First, there are often variations in height between the two circuit substrates 10 and 12 to be mated due to inconsistencies in the flatness of one or both of the circuit substrates 10 or 12. These variations may also arise due to inconsistencies in the thickness of any hardware located between the circuit substrates 10 and 12. On a typical system, where two circuit substrates 10 and 12 are to be mated, a variation in height between approximately 0.05 to 250 mm (2 to 10,000 mils) may exist between electrical contact pads 16a and solder bodies 20. Second, the rigid nature of the solder material in solder body 20 renders it unlikely that all of the solder bodies 20 throughout the system will deform to the extent necessary under typical compressive forces to provide uniformly the desired reliable electrical connections.

Accordingly, a need remains for an improved socket connector system which forms a separable and reliable electrical connection between circuit substrates.

SUMMARY OF THE INVENTION

To meet this and other needs, and in view of its purposes, the present invention provides a socket connector system forming a separable electrical contact between a first circuit substrate and a second circuit substrate. A dendrite interposer is disposed between the first circuit substrate and the second circuit substrate. A solder body is disposed between the first circuit substrate and the dendrite interposer. The solder body has a contact end which engages the dendrite interposer. The contact end has a void.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION

Figure 2:
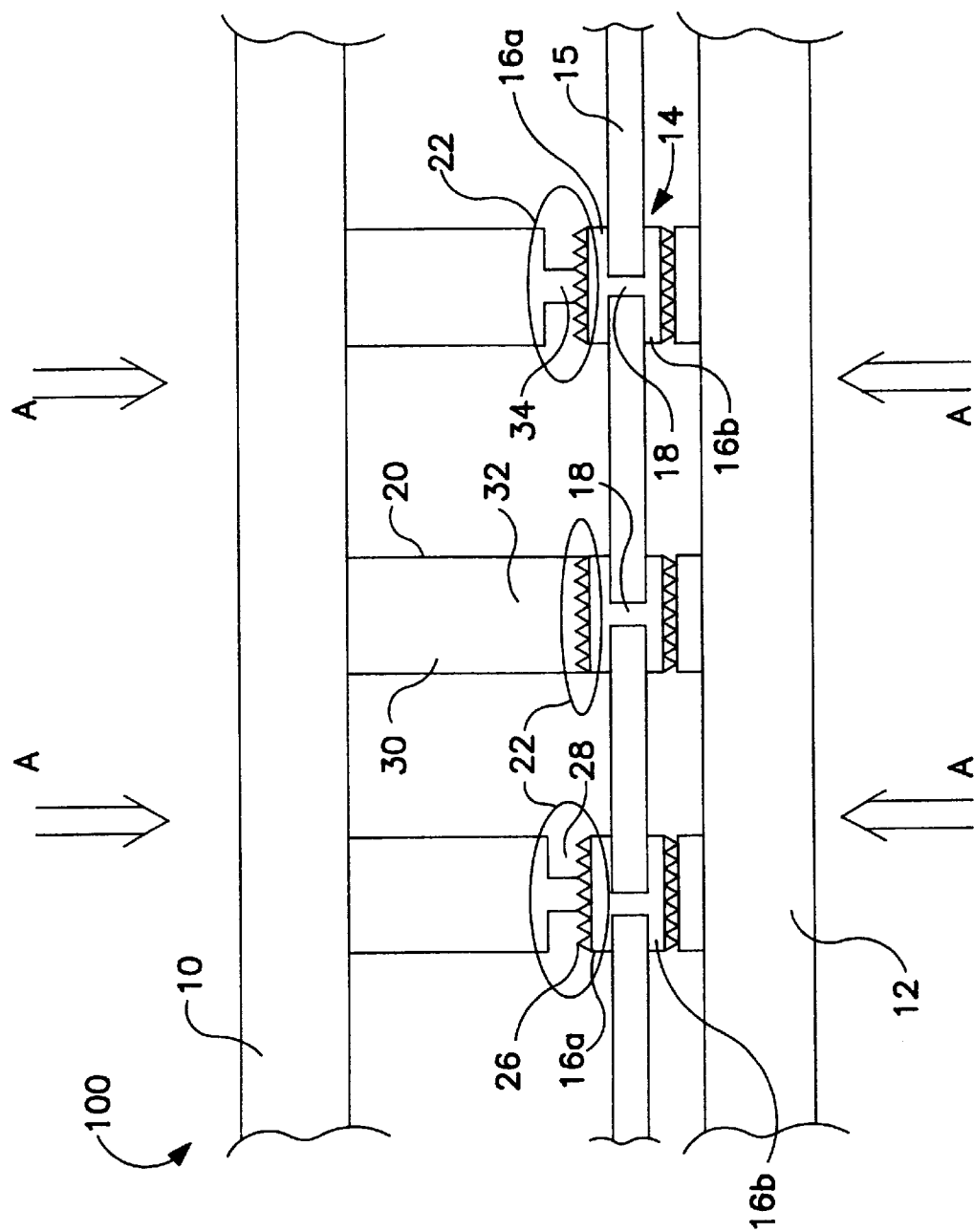
FIG. 2 illustrates a socket connector system according to one exemplary embodiment of the present invention.

Referring now to the drawing, wherein like reference numerals refer to like elements throughout, FIG. 2 illustrates a socket connector system 100 according to the present invention. The system 100 forms a separable electrical contact between a first circuit substrate 10 and a second circuit substrate 12 when the two substrates are compressed. That is, first circuit substrate 10 can be easily unplugged from second circuit substrate 12 after the two are mated.

As shown in FIG. 2, a dendrite interposer 14 is disposed between first circuit substrate 10 and second circuit substrate 12. Dendrite interposer 14 is typically on the order of several millimeters thick. The Flexiposer™ dendrite by International Business Machines Corporation is suitable. Dendrite interposer 14 includes: (a) a carrier 15 made of polyamide film or other similar type of circuit board material, and (b) pairs of electrical contact pads 16a and 16b attached to the carrier 15.

Contact pads 16a and 16b are generally flat and are preferably made with gold or nickel alloy. A pair of contact pads includes: (a) a circuit contact pad 16b attached to dendrite interposer 14 and facing second circuit substrate 12; and (b) a solder contact pad 16a attached to dendrite interposer 14 and facing solder body 20. For a given pair, contact pads 16a and 16b are attached to the carrier 15 on opposing sides and electrically coupled to one another through vias 18 formed in the carrier 15. Solder contact pad 16a has a plurality of ridges 26, illustrated in FIG. 2, extending from dendrite interposer 14 toward solder body 20. Circuit contact pad 16b is similarly provided with a plurality of ridges 26, illustrated in FIG. 2, extending from dendrite interposer 14 toward second circuit substrate 12. Ridges 26 are typically needle-like structures of palladium which are grown off circuit contact pads 16a and 16b. Ridges 26 generally function to penetrate dust and debris in forming an electrical contact between mating surfaces of circuit substrates 10 and 12. Ridges 26 are typically on the order of 0.025 to 0.051 mm (1 to 2 mils) in height.

A solder body 20 is disposed between first circuit substrate 10 and dendrite interposer 14. Solder body 20 has a mounting end 30 mounted on first circuit substrate 10. Solder body 20 has a contact end 32 facing dendrite interposer 14. Contact end 32 engages dendrite interposer 14 when compressive forces, in the direction of arrows A in FIG. 2, are exerted on first circuit substrate 10 and second circuit substrate 12. Unlike conventional systems, socket connector system 100 provides for all contact ends 32 to engage and form reliable electrical contacts, in areas 22, with all of the contact pads 16a.

Figure 3:
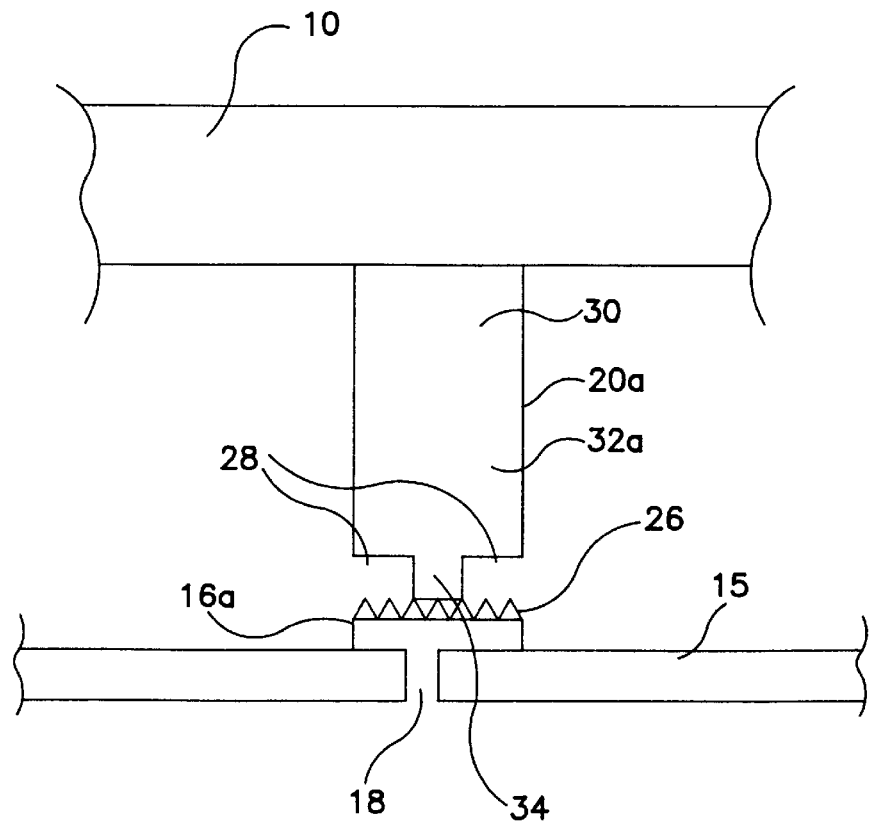
FIG. 3 illustrates a solder column according to the first embodiment of the present invention.
Figure 5:
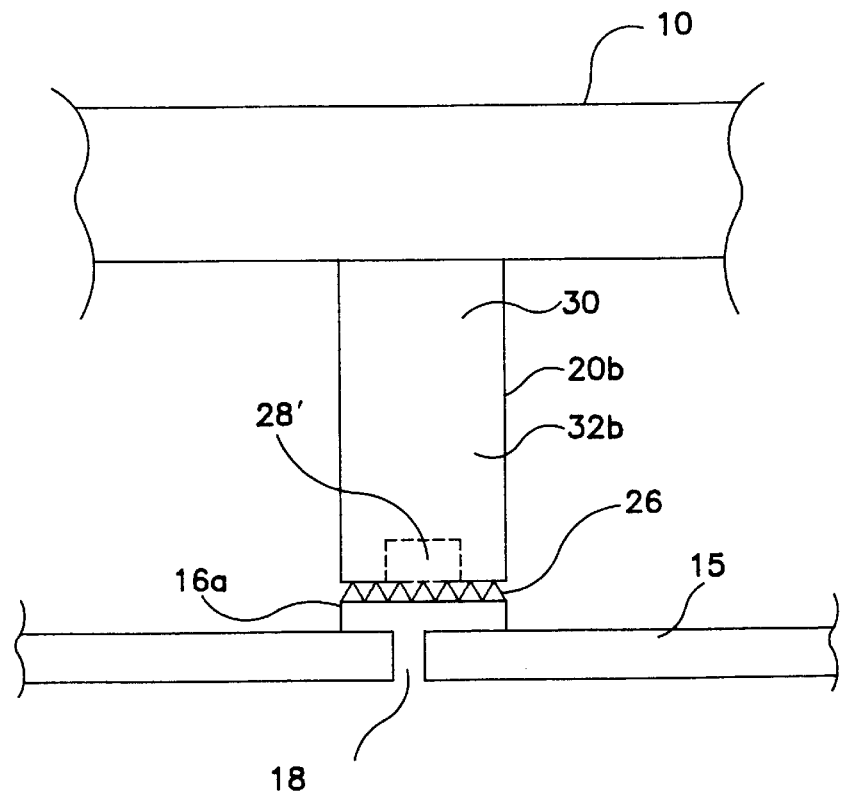
FIG. 5 illustrates a solder column according to a second embodiment of the present invention.
Figure 7:
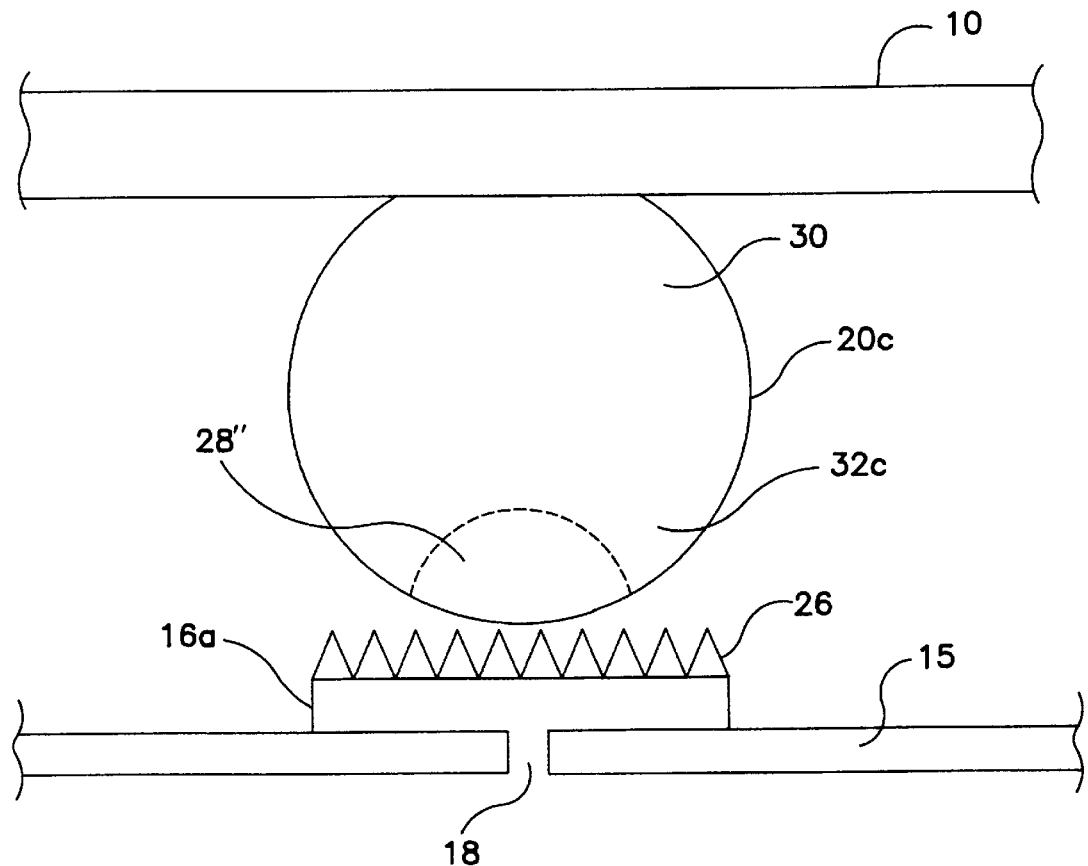
FIG. 7 illustrates a solder ball according to a third embodiment of the present invention.

In one embodiment according to the present invention, solder body 20 includes a solder column 20a, as illustrated in FIG. 3. In another embodiment according to the present invention, solder body 20 includes a solder column 20b, as illustrated in FIG. 5. In yet another embodiment according to the present invention, solder body 20 includes a solder ball 20c, as illustrated in FIG. 7.

Contact end 32 has a void 28 in area 22 engaging dendrite interposer 14. In one embodiment of the present invention, void 28 in contact end 32 is provided such that the area of contact end 32 engaging dendrite interposer 14 is less than a predetermined area of mounting end 30 which engages first circuit substrate 10. As illustrated in FIGS. 2 and 3, in another embodiment of the present invention in which solder body 20 includes solder column 20a, void 28 is formed by a solder column extension 34 protruding from contact end 32a of solder column 20a.

Figures 4A, 4B:
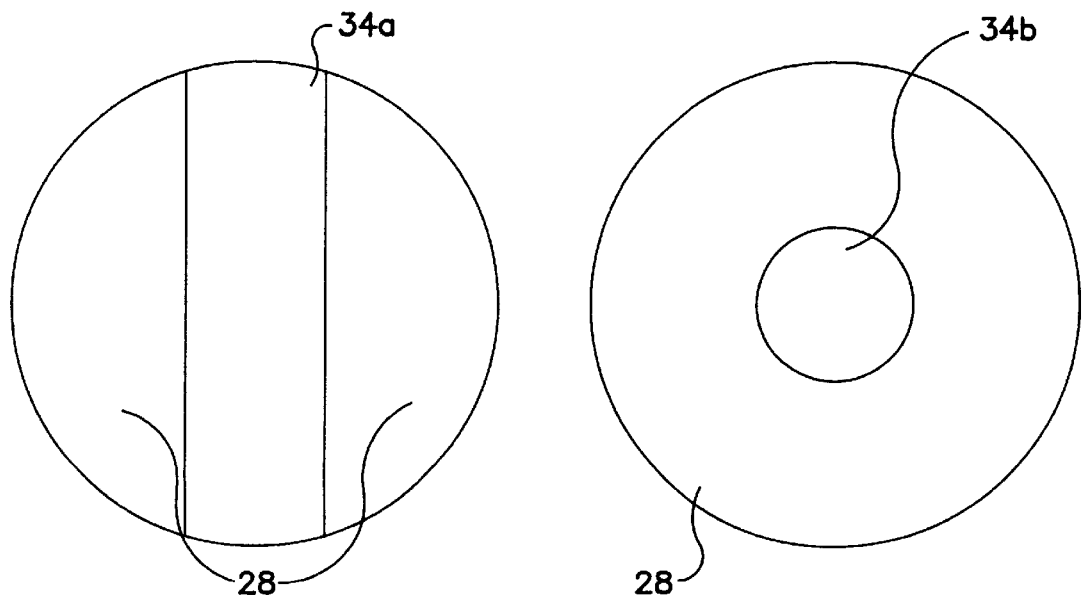
FIGS. 4A and 4B illustrate two examples of contact ends of a solder column according to the first embodiment of the present invention.

As illustrated in FIG. 4A, one example of solder column extension 34 is in the form of a substantially rectangular tab 34a. Illustrated in FIG. 4B, solder column extension may also be in the form of a cylinder 34b. In both FIGS. 4A and 4B, a void 28 is still formed by solder column extensions 34a and 34b. Void 28 in these embodiments of the present invention is formed by the removal of material in the peripheral region of contact end 32a surrounding centrally disposed column extension 34.

Figures 6A, 6B:
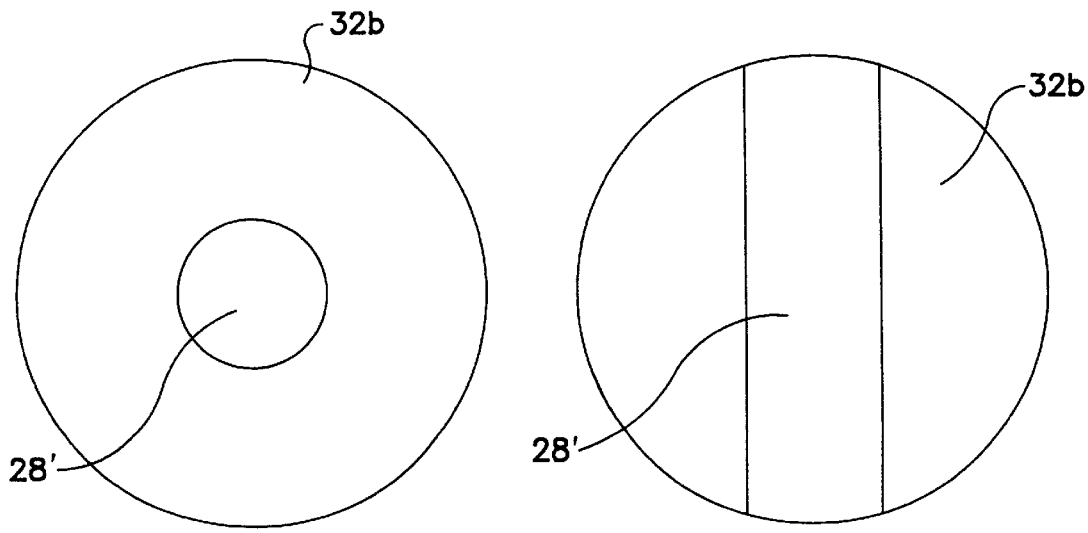
FIGS. 6A and 6B illustrate two examples of contact ends of a solder column according to the second embodiment of the present invention.

As illustrated in FIGS. 5, 6A, and 6B, in another embodiment of the present invention in which solder body 20 includes solder column 20b, void 28' is defined by a bore in contact end 32b of solder column 20b. In one example of this embodiment, in which solder body 20 includes solder column 20b, void 28' is defined by a trench formed in contact end 32b of solder column 20b (see FIG. 6B). In the example illustrated in FIG. 6A, void 28' is defined by a centrally disposed hole formed in contact end 32b of solder column 20b. Void 28' in these embodiments of the present invention is formed by the removal of material in the central region of contact end 32b and is surrounded by column extension 34.

Figure 8:
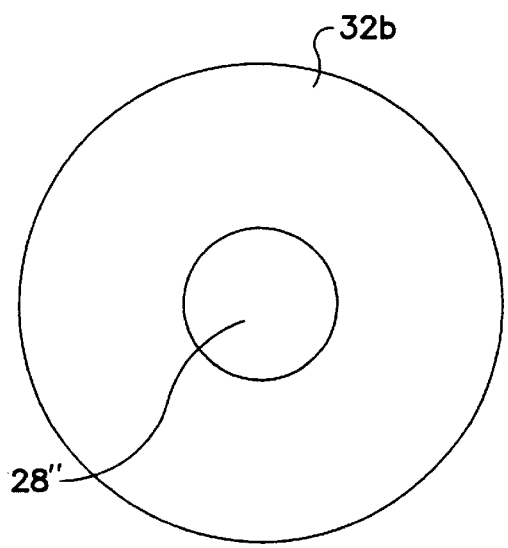
FIG. 8 illustrates a contact end of a solder ball according to the third embodiment of the present invention.

FIGS. 7 and 8 show yet another embodiment of the present invention. As illustrated in these Figures, solder body 20 includes solder ball 20c and void 28" is defined by a bore in contact end 32c of solder ball 20c.

According to socket connector system 100 of this invention, as illustrated in FIG. 2, ridges 26 of solder contact pads 16a engage contact ends 32 of solder bodies 20 when first circuit substrate 10 and second circuit substrate 12 are compressed, such that ridges 26 of solder contact pads 16a and contact ends 32 of solder bodies 20 form separable and reliable electrical contacts throughout the system 100. In addition, circuit contact pads 16b engage second circuit substrate 12 when first circuit substrate 10 and second circuit substrate 12 are compressed, such that ridges 26 of circuit contact pads 16b and second circuit substrate 12 form separable and reliable electrical contacts throughout the system 100.

Figure 1:
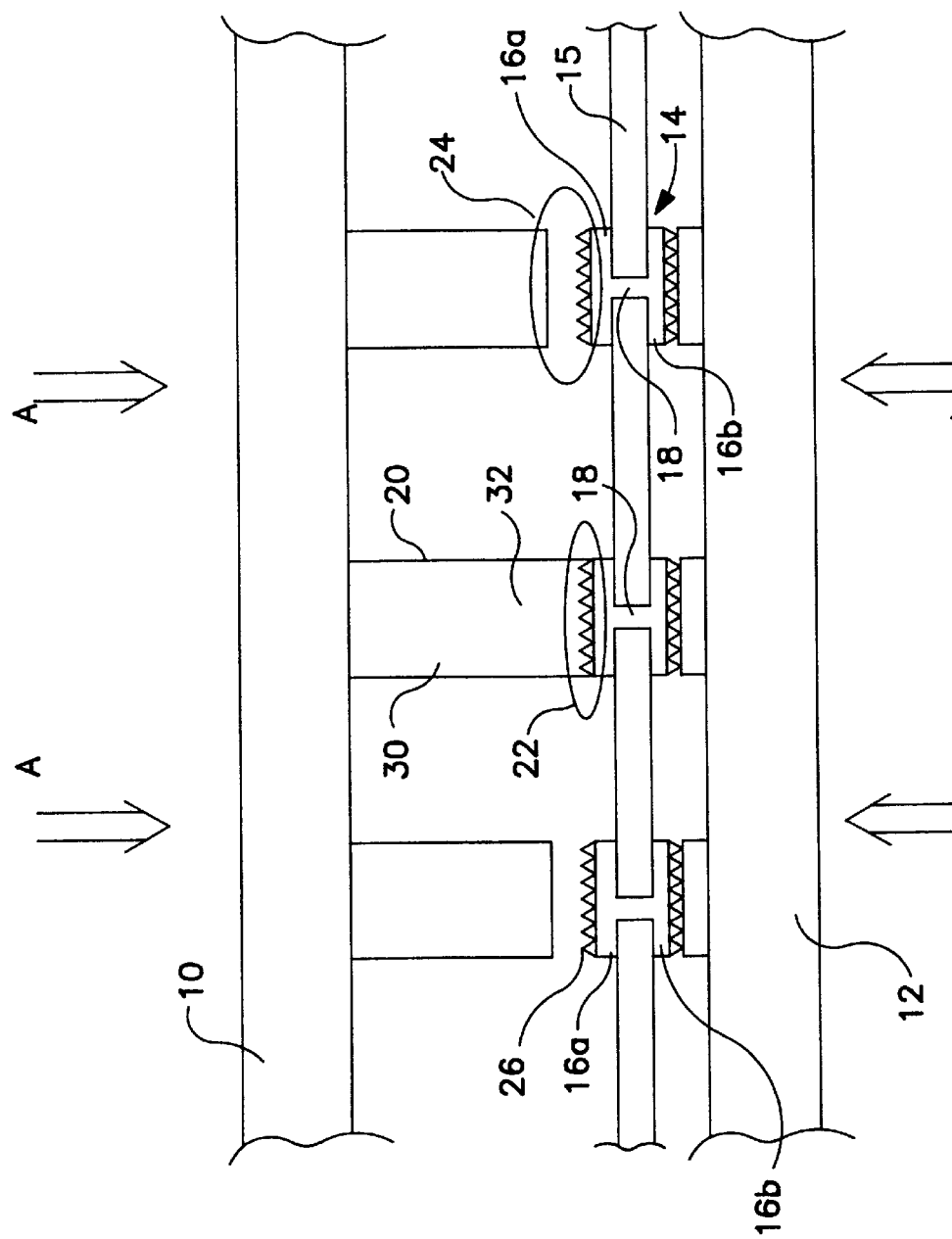
FIG. 1 illustrates a conventional socket connector system.

As mentioned above, rarely do all of the solder bodies 20 form reliable electrical contacts with the contact pads 16a in the conventional socket connector system illustrated in FIG. 1. Often, solder body 20 makes only a poor or non-existent electrical contact with contact pad 16a (see area 24 of FIG. 1). This problem results from inherent tolerance variations in the conventional socket connector system of FIG. 1. The present invention overcomes this problem. Void 28 renders contact end 32 of solder body 20 more compliant and responsive to the compressive forces exerted on first circuit substrate 10 and second circuit substrate 12. Accordingly, when the first of contact ends 32 to engage contact pads 16a makes contact, that contact end 32 compresses (see the central contact end 32 of FIG. 2). Such compression allows the remaining contact ends 32 to engage their respective contact pads 16a (see the non-central contact ends 32 of FIG. 2).

According to another embodiment of the present invention, the socket connector system of the present invention is used in a test-and-burn-in socket where, for example, it is desirable to test single chip and multi-chip modules before permanently soldering them to circuit boards used in production. The socket connector system according to the present invention can be used to form a separable electrical connection according to the following steps: (1) solder the chip modules to test equipment, (2) burn-in the chip modules, (3) test the chip modules, (4) unplug the chip modules, and (5) permanently solder the chip modules onto circuit boards for production. This provides the advantage of allowing one to do a test and burn-in on even high density chips.

Socket connector system 100 according to the present invention provides the desired reliable electrical contacts over all of the contact pads in the system. The present invention overcomes the tolerance variations that exist throughout the conventional socket connector system. Moreover, the solder bodies according to the present socket connector system can deform under lower compressive forces to provide reliable electrical connections.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed is:

1. A socket connector system for forming a separable electrical contact between a first circuit substrate and a second circuit substrate comprising:
   a dendrite interposer disposed between the first circuit substrate and the second circuit substrate; and
   a solder body disposed between the first circuit substrate and the dendrite interposer, the solder body having a contact end engaging the dendrite interposer, the contact end having a void, and the void is formed by a solder column extension protruding from the contact end of the solder body.

2. A socket connector system according to claim 1 wherein the solder body includes a solder column.

3. A socket connector system according to claim 1 further comprising a solder contact pad attached to the dendrite interposer and engaging the solder body, the solder contact pad having a plurality of ridges extending from the dendrite interposer toward the solder body, the ridges of the solder contact pad and the contact end of the solder body forming a separable electrical contact.

4. A socket connector system according to claim 3 further comprising a circuit contact pad attached to the dendrite interposer and engaging the second circuit substrate, the circuit contact pad having a plurality of ridges extending from the dendrite interposer toward the second circuit substrate, the ridges of the circuit contact pad and the second circuit substrate forming a separable electrical contact.

5. A socket connector system according to claim 4 wherein the circuit contact pad is disposed opposite the solder contact pad, the circuit contact pad and the solder contact pad being electrically connected through a via formed in the dendrite interposer.

6. A socket connector system for forming a separable electrical contact between a first circuit substrate and a second circuit substrate comprising:
   a dendrite interposer disposed between the first circuit substrate and the second circuit substrate; and
   a solder body disposed between the first circuit substrate and the dendrite interposer, the solder body having:
   (a) a mounting end mounted on the first circuit substrate and having a predetermined area; and
   (b) a contact end engaging the dendrite interposer and having a void in an area engaging the dendrite interposer such that the area of the contact end engaging the dendrite interposer is less than the area of the mounting end, the area of the contact end engaging the dendrite interposer is continuous and undivided, and the void is formed by a solder column extension protruding from the contact end of the solder body.

7. A socket connector system according to claim 6 wherein the solder body includes a solder column.

8. A socket connector system according to claim 6 further comprising a solder contact pad attached to the dendrite interposer and facing the solder body, the solder contact pad having a plurality of ridges extending from the dendrite interposer toward the solder body, the ridges of the solder contact pad and the contact end of the solder body forming a separable electrical contact.

9. A socket connector system according to claim 6 further comprising a circuit contact pad attached to the dendrite interposer and facing the second circuit substrate, the circuit contact pad having a plurality of ridges extending from the dendrite interposer toward the second circuit substrate, the ridges of the circuit contact pad and the second circuit substrate forming a separable electrical contact.

10. A socket connector system for forming a separable electrical contact between a first circuit substrate and a second circuit substrate comprising:
    a dendrite interposer disposed between the first circuit substrate and the second circuit substrate; and
    a solder column disposed between the first circuit substrate and the dendrite interposer, the solder column having a mounting end mounted on the first circuit substrate and a contact end facing the dendrite interposer and having a void, the void is formed by a solder column extension protruding from the contact end of the solder column.

11. A socket connector system for forming a separable electrical contact between a first circuit substrate and a second circuit substrate comprising:
    a dendrite interposer disposed between the first circuit substrate and the second circuit substrate;
    a solder column disposed between the first circuit substrate and the dendrite interposer, the solder column having (a) a mounting end mounted on the first circuit substrate and having a predetermined area, and (b) a contact end engaging the dendrite interposer and having a void in an area engaging the dendrite interposer such that the area of the contact end engaging the dendrite interposer is less than the area of the mounting end, and the void is formed by a solder column extension protruding from the contact end of the solder column;
    a solder contact pad attached to the dendrite interposer and facing the solder column, the solder contact pad having a plurality of ridges extending from the dendrite interposer toward the solder column, the ridges of the solder contact pad and the contact end of the solder column forming a separable electrical contact; and
    a circuit contact pad attached to the dendrite interposer and facing the second circuit substrate, the circuit contact pad having a plurality of ridges extending from the dendrite interposer toward the second circuit substrate, the ridges of the circuit contact pad and the second circuit substrate forming a separable electrical contact.

* * * * *